United States Patent
Yang et al.

(10) Patent No.: US 9,095,063 B2
(45) Date of Patent: Jul. 28, 2015

(54) PRINTED CIRCUIT BOARD AND METHOD OF MANUFACTURING THE SAME

(71) Applicant: SAMSUNG ELECTRO-MECHANICS CO., LTD., Suwon-si (KR)

(72) Inventors: Eun Ju Yang, Suwon-si (KR); Gyu Seok Kim, Suwon-si (KR); Suk Jin Ham, Suwon-si (KR); Se Yoon Park, Suwon-si (KR); Jin Uk Cha, Suwon-si (KR); Hee Suk Chung, Suwon-si (KR); Mi Yang Kim, Suwon-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 14/182,206

(22) Filed: Feb. 17, 2014

(65) Prior Publication Data
US 2015/0136458 A1    May 21, 2015

(30) Foreign Application Priority Data

Nov. 19, 2013    (KR) .................. 10-2013-0140862

(51) Int. Cl.
*H05K 1/09* (2006.01)
*H05K 3/02* (2006.01)
*H05K 1/03* (2006.01)
*C23F 4/04* (2006.01)
*C23C 14/34* (2006.01)
*H05K 3/06* (2006.01)

(52) U.S. Cl.
CPC *H05K 1/09* (2013.01); *C23C 14/34* (2013.01); *C23F 4/04* (2013.01); *H05K 1/03* (2013.01); *H05K 3/06* (2013.01)

(58) Field of Classification Search
CPC .................. H01L 21/823871; H01L 2924/14; H01L 33/16; G02F 1/1345; H05K 3/361
See application file for complete search history.

(56) References Cited

U.S. PATENT DOCUMENTS

| | | | | |
|---|---|---|---|---|
| 5,456,978 | A * | 10/1995 | Lal et al. ................ | 428/332 |
| 6,875,324 | B2 * | 4/2005 | Hara et al. ............ | 204/298.12 |
| 7,821,018 | B2 * | 10/2010 | Osawa et al. ............ | 257/90 |
| 2002/0100909 | A1 * | 8/2002 | Yamaguchi et al. ............ | 257/59 |
| 2002/0102823 | A1 * | 8/2002 | Yamaguchi et al. .......... | 438/487 |
| 2009/0111247 | A1 * | 4/2009 | Tanaka et al. .............. | 438/479 |
| 2010/0026952 | A1 * | 2/2010 | Miura et al. ............... | 349/150 |
| 2011/0017020 | A1 * | 1/2011 | Homma et al. ................. | 75/403 |
| 2011/0027968 | A1 * | 2/2011 | Yamazaki et al. ............ | 438/458 |
| 2013/0127295 | A1 * | 5/2013 | Jun et al. .................. | 310/327 |

FOREIGN PATENT DOCUMENTS

KR    10-2009-0105162 A    10/2009

* cited by examiner

*Primary Examiner* — Evan Pert
*Assistant Examiner* — Gustavo Ramallo
(74) *Attorney, Agent, or Firm* — Ladas & Parry, LLP

(57) ABSTRACT

Disclosed herein are a printed circuit board and a method of manufacturing the same. In detail, according to a preferred embodiment of the present invention, the printed circuit board includes: an insulating layer; and a metal layer formed on the insulating layer, wherein in the metal layer, a ratio occupied by crystal orientations of (110) and (112) is 20 to 80%. By doing so, the preferred embodiment of the present invention provides a printed circuit board including the metal layer having different crystal orientations to minimize factors of hindering electrical characteristics such as electric conductivity and improve isotropy of mechanical properties and a method of manufacturing the printed circuit board.

12 Claims, 3 Drawing Sheets

PRINTED CIRCUIT BOARD AND METHOD OF MANUFACTURING THE SAME

CROSS REFERENCE TO RELATED APPLICATION

This application claims the benefit of Korean Patent Application No. 10-2013-0140862, filed on Nov. 19, 2013, entitled "Printed Circuit Board and Method of Manufacturing the Same," which is hereby incorporated by reference in its entirety into this application.

BACKGROUND OF THE INVENTION

1. Technical Field

The present invention relates to a printed circuit board and a method of manufacturing the same.

2. Description of the Related Art

Recently, as a substrate serving as an interposer between the substrate and electronic devices becomes light, thin, short, and small rapidly, a high-density and fine pattern has been required. Various attempts to simplify the existing process together with improvement in technologies have been progressed.

There is an additive method of forming a circuit pattern of a printed circuit board. The additive method is to form the circuit pattern on an insulating layer by a plating scheme. Recently, a semi additive method of more efficiently performing a plating scheme has been used. The semi additive method performs surface treatment on the insulating layer to increase roughness and forms a seed layer, which is a base layer for electroplating, by chemical plating. The circuit pattern is completed by forming the seed layer and then performing the electroplating till a thickness of the circuit pattern reaches a predetermined level.

The existing semi additive method requires a surface roughness treatment process and a thickness of 10,000 Å or more to entirely, uniformly form the seed layer on the substrate. When the thickness of the seed layer is larger, there is a problem in that a lead time of a flash etching process to form the circuit pattern and then remove the seed layer may be long and it is difficult to form a fine pitch.

Therefore, when a sputtering process is applied during a process of forming a metal layer of the printed circuit board, the number of processes is reduced, such that the lead time of the process may be short and costs may be saved correspondingly. Further, the circuit pattern having the fine pitch may be implemented by forming the thin, uniform seed layer.

For this reason, as the substrate is miniaturized and highly integrated, a demand for the sputtering process scheme is more increased than the existing plating scheme. The sputtering process scheme may be formed a thin film at a thin thickness. In this case, the film undergoes the process, and thus most of the film is grown to have a crystal orientation of (111). When the crystal orientation is grown only the specific direction, the thin film has a deflective characteristic in terms of mechanical properties, due to anisotropy of a material.

Meanwhile, Patent Document 1 discloses a manufacturing method of forming the seed layer using the sputtering process, in the method for manufacturing a printed circuit board, but the so formed seed layer has a limitation in terms of the anisotropy of the material physical property. Further, the seed layer may have very strong mechanical physical property in a thickness direction, but have a relatively weak physical property in a lateral direction.

Patent Document 1: Korean Patent Laid-Open Publication No. 2009-0105162

SUMMARY OF THE INVENTION

The present invention has been made in an effort to provide a printed circuit board including a metal layer having different crystal orientations to minimize factors of hindering electrical characteristics such as electric conductivity and improve isotropy of mechanical properties.

Further, the present invention has been made in an effort to provide a method of manufacturing a printed circuit board using a metal layer.

According to a preferred embodiment of the present invention, there is provided a printed circuit board, including: an insulating layer; and a metal layer formed on the insulating layer, wherein in the metal layer, a ratio occupied by crystal orientations of (110) and (112) may be 20 to 80%.

The crystal orientations of (110) and (112) may be formed in an island type.

The crystal orientations of (110) and (112) may have a twin structure.

A material of the metal layer may include copper (Cu).

According to another preferred embodiment of the present invention, there is provided a method of manufacturing a printed circuit board, including: preparing an insulating layer; forming a metal layer on the insulating layer; and etching the metal layer by dry etching, wherein in the metal layer, a ratio occupied by crystal orientations of (110) and (112) is 20 to 80%.

The forming of the metal layer may be performed by a deposition method.

The deposition method may be sputtering.

The etching of the metal layer by dry etching may be performed by ion beam etching.

An ion source of the ion beam etching may be gallium (Ga).

The crystal orientations of (110) and (112) may be formed in an island type.

The crystal orientations of (110) and (112) may have a twin structure.

A material of the metal layer may include copper (Cu).

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
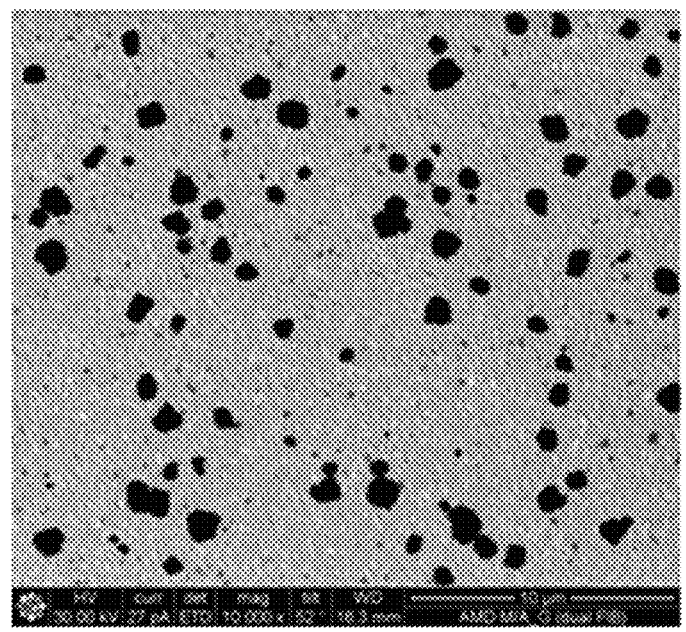
FIG. 1 is a plan view of a metal layer of a printed circuit board according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "one side," "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Printed Circuit Board

FIG. 1 is a plan view of a metal layer of a printed circuit board according to a preferred embodiment of the present invention.

Referring to FIG. 1, the printed circuit board according to the preferred embodiment of the present invention includes an insulating layer 100 and a metal layer 200 formed on the insulating layer 100, in which in the metal layer 200, a ratio of an area occupied by crystal orientations 20 of (110) and (112) may be 20 to 80%.

Generally, when a sputtering process is performed to form the metal layer 200, the metal layer 200 may have (111) as a main crystal orientation. In addition, when a part of the crystal orientations of (220), (112), or the like may be included, a ratio thereof may be limited or may be locally present.

However, the printed circuit board including the formed metal layer 200 may have a limitation in anisotropy of material properties. That is, an elastic modulus value depending on the crystal orientation of the metal layer 200 is very strong physical properties in a thickness direction, but may have relatively very small in a lateral direction.

Therefore, in the printed circuit board according to the preferred embodiment of the present invention, the metal layer 200 includes the crystal orientations 20 of (110) and (112), such that the elastic modulus of the metal layer 200 may have excellent physical properties in a thickness direction and a lateral direction.

When in the metal layer 200, the ratio of the area occupied by the crystal orientations 20 of (110) and (112) is less than 20%, the elastic modulus of the metal layer 200 may be relatively weak in the lateral direction and when the ratio of the area exceeds 80%, many grain boundaries are distributed within the metal layer 200 and thus electrons may not flow smoothly and a scattering phenomenon occurs and thus electrical resistance may also be increased.

Figure 2:
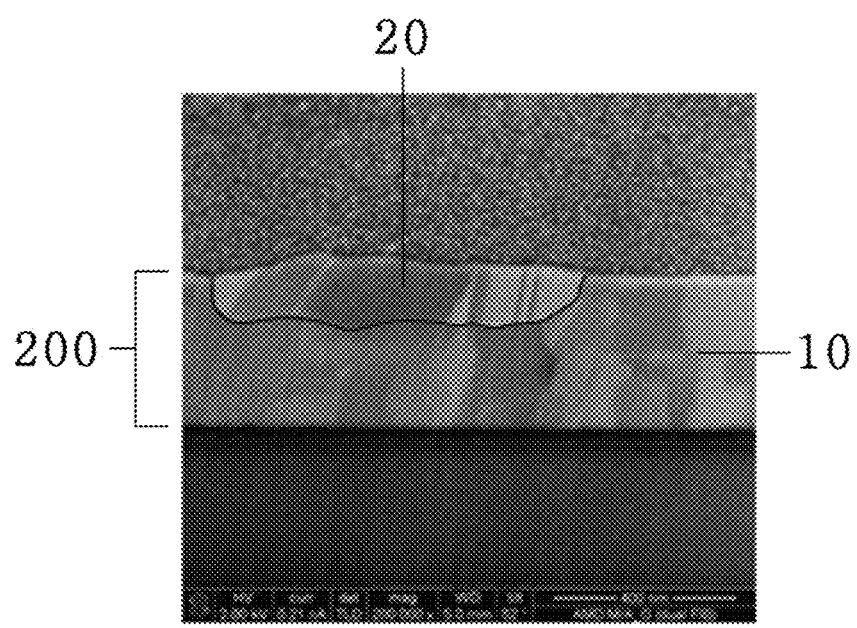
FIG. 2 is a cross-sectional view of the printed circuit board according to the preferred embodiment of the present invention.

FIG. 2 is a cross-sectional view of the printed circuit board according to the preferred embodiment of the present invention.

Referring to FIG. 2, the crystal orientations 20 of (110) and (112) may be formed in an island type. The crystal orientations 20 of (110) and (112) are present in the island type, such that the isotropy of mechanical properties may be improved. That is, the crystal orientations 20 of (110) and (112) have a grain shape and soft grains of (110) and (112) are positioned between the strong grains of the existing crystal orientation 10 of (111), such that the mechanical deformation occurring during the process may be accepted well.

Figure 3:
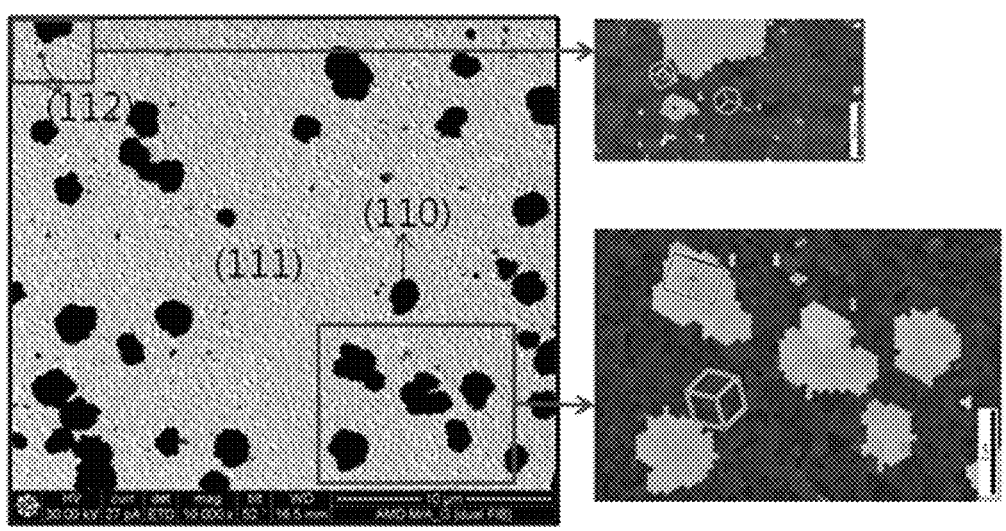
FIG. 3 is a photograph of the metal layer of the printed circuit board according to the preferred embodiment of the present invention which is analyzed by electron back-scattered diffraction (EBSD)

FIG. 3 is a photograph of the metal layer 200 of the printed circuit board according to the preferred embodiment of the present invention which is analyzed by electron back-scattered diffraction (EBSD). Referring to FIG. 3, the electron back-scattered diffraction technique is equipment which is used to analyze the orientations of each of the grains by using a kikuchi pattern of back-scattered electrons. The crystal material has different orientations for each grain, and therefore a diffraction form of the back-scattered electrons is changed when an electron beam generated from an electron microscope is irradiated to a sample. Therefore, a structure analysis using the electron back-scattered diffraction may be analyzed by analyzing the crystal orientation. Herein, the kikuchi pattern means a band type obtained when an electron beam is incident on a single crystal or a diffraction pattern which is formed as a pair of parallel lines of contrast.

Therefore, it may be appreciated that the crystal orientations 20 of (110) and (112) of the metal layer 200 of the printed circuit board according to the preferred embodiment of the present invention have a twin structure by using the electron back-scattered diffraction.

In the grain boundary which is a section in which the crystal orientation is changed, the electrons do not flow smoothly due to a lattice mismatch and the scattering occurs, such that the electrical resistance may be increased. In the electrical connection of the metal layer 200, one of the big factors hindering the progress may be considered as the grain boundary. When electrons pass through the grain boundary of which the atom arrangement is in disorder, the scattering occurs, such that the electrons may not flow smoothly, thereby increasing the electrical resistance.

However, since the crystal orientations 20 of (110) and (112) have the twin structure, the grain boundaries are not in disorder and are arranged having a constant rule. Therefore, the grain having the crystal orientations 20 of (110) and (112) may minimize the hindrance of the flow of electrons.

An example of the material of the metal layer 200 of the printed circuit board according to the preferred embodiment of the present invention may include copper (Cu) which is most appropriate when considering an economic aspect and an electric conductivity aspect.

Further, although not particularly limited, the thickness of the metal layer 200 may range from 30 to 300 nm. When the thickness of the metal layer 200 is less than 30 nm, the crystal orientation is little changed by ion beam etching, and the etching is more rapidly performed than forming a slip surface by ion implantation energy such that the metal layer 200 formed by the sputtering may also disappear. When the thickness of the metal layer 200 exceeds 300 nm, since the crystal orientation which does not cause a phase change of an inner layer is more dominated than a crystal orientation of a surface layer, it may difficult to control a direction of a crystal surface for the film.

Method of Manufacturing Printed Circuit Board

Figure 4:
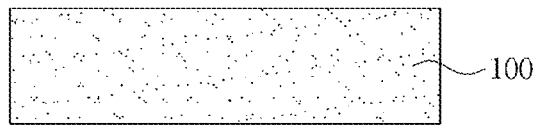
FIGS. 4 to 6 are cross-sectional views illustrating a manufacturing process flow for describing a method of manufacturing a printed circuit board according to a preferred embodiment of the present invention.
Figure 5:
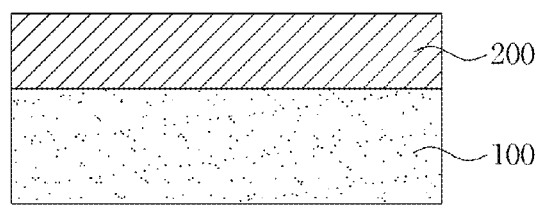
Figure 6:
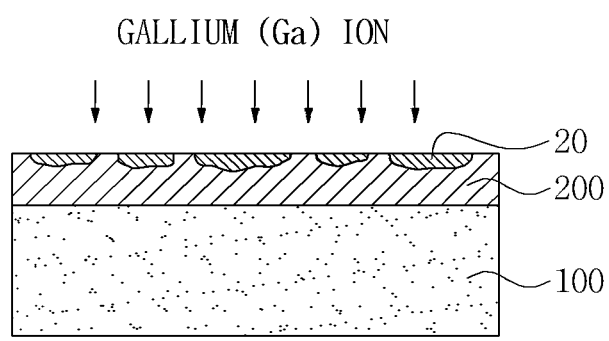

FIGS. 4 to 6 are cross-sectional views illustrating a manufacturing process flow for describing a method of manufacturing a printed circuit board according to a preferred embodiment of the present invention.

The method of manufacturing a printed circuit board according to a preferred embodiment of the present invention includes: preparing the insulating layer 100; forming the metal layer 200 on the insulating layer 100; and etching the metal layer 200 by dry etching, in which in the metal layer 200, the ratio of the area occupied by the crystal orientations 20 of (110) and (112) may be 20 to 80%.

Referring to FIG. 4, the insulating layer 100 may include silicon dioxide ($SiO_2$), but is not particularly limited thereto. Further, the insulating layer 100 made of an epoxy resin composition may be used.

Referring to FIG. 5, the forming of the metal layer 200 may be performed by a deposition method. Further, the deposition method may be sputtering.

The sputtering is a technology of escaping metal molecules by colliding inert elements such as argon (Ar) with a target and then attaching a film on a surface. When DC power is applied to the target while inert gas as sputtering gas flows within a chamber in a vacuum state, plasma occurs between the substrate to be deposited and the target. The inert gas is ionized into anion within the plasma by a high output DC amperemeter. The anion of the inert gas is accelerated to a cathode by the DC ampere meter and thus collides with the surface of the target. In the so colliding target material, an atom jumps out from the surface to the outside by exchanging momentum by perfectly elastic collision. When ions collide with each other with kinetic energy larger than inter-atom bond energy, an interstitial atom of the material is pushed to another position by the collision of ions. In this case, the surface escaping of the atom occurs, which is referred to as the sputtering.

When the sputtering is performed by using the metal plate made of the metal material to be plated as the target, the metal atom jumping out from the metal plate adheres to the insulating layer 100, such that the metal layer 200 may be formed uniformly. An example of the material of the metal plate forming the metal layer 200 may include copper (Cu) which is most appropriate when considering the economic aspect and the electric conductivity aspect.

When in the metal layer 200, the ratio of the area occupied by the crystal orientations 20 of (110) and (112) is less than 20%, the elastic modulus of the metal layer 200 may be relatively weak in the lateral direction and when the ratio of the area exceeds 80%, many grain boundaries are distributed within the metal layer 200 and thus electrons may not flow smoothly and a scattering phenomenon occurs and thus electrical resistance may also be increased.

Further, although not particularly limited, the thickness of the metal layer 200 may range from 30 to 300 nm. When the thickness of the metal layer 200 is less than 30 nm, the crystal orientation is little changed by ion beam etching, and the etching is more rapidly performed than forming a slip surface by ion implantation energy such that the metal layer 200 formed by the sputtering may also disappear.

When the thickness of the metal layer 200 exceeds 300 nm, since the crystal orientation which does not cause a phase change of an inner layer is more dominated than a crystal orientation of a surface layer, it may difficult to control a direction of a crystal surface for the film.

Referring to FIG. 6, the etching of the metal layer 200 by dry etching may be performed by the ion beam etching. Further, an ion source of the ion beam etching may be gallium (Ga).

The ion beam is a cluster of molecules or atoms having charges as a mass of ion flow and when an electric field or a magnetic field is applied to the ion, the flow of ion may be accelerated. The accelerated ion in a high energy state is irradiated to the surface of the metal layer 200, thereby etching a part of the metal layer 200.

The printed circuit board according to the preferred embodiment of the present invention uses a phenomenon in which the crystal orientation is changed while being etched when the gallium (Ga) ion is irradiated to the metal layer 200. In this case, the driving force changing the crystal orientation may be heat energy or mechanical collision energy.

Generally, when the sputtering process is performed to form the metal layer 200, the metal layer 200 may have (111) as a main crystal orientation. In addition, when a part of the crystal orientations of (220), (112), or the like may be included, a ratio thereof may be limited or may be locally present.

However, the printed circuit board including the formed metal layer 200 may have a limitation in anisotropy of material properties. That is, a modulus value depending on the crystal orientation of the metal layer 200 is very strong physical properties in a thickness direction, but may have a relatively very small value.

Therefore, in the printed circuit board according to the preferred embodiment of the present invention, the gallium (Ga) ion fills an empty space from which a part of the metal layer 200 is separated when the gallium (Ga) ion is irradiated to the metal layer 200. In this case, the crystal orientation 10 of (111) is changed to the crystal orientations 20 of (110) and (112) while the empty space from which the metal layer 200 of the crystal orientation 10 of (111) is separated is filled with the gallium (Ga) ion.

By doing so, the metal layer 200 has different crystal orientations and the elastic modulus of the metal layer 200 may have the excellent physical properties in the thickness direction and the lateral direction.

In the process of forming the crystal orientations 20 of (110) and (112) on the metal layer 200 by the ion beam etching, the ratio of the crystal orientations 20 of (110) and (112) included in the metal layer 200 may be controlled by the exposure time, acceleration voltage, or current amount of the ion beam.

To improve the adhesion between the insulating layer 100 and the metal layer 200, one adhesive layer may also be formed between the insulating layer 100 and the metal layer 200. The adhesive layer may be made of, for example, titanium (Ti), chromium (Cr), nickel (Ni), iron (Fe), zirconium (Zr), tantalum (Ta), aluminum (Al), tungsten (W), platinum (Pt), or a mixture thereof, but is not particularly limited thereto.

The crystal orientations 20 of (110) and (112) may be formed in the island type. The crystal orientations 20 of (110) and (112) are present in the island type, such that the isotropy of mechanical properties may be improved. That is, the crystal orientations 20 of (110) and (112) have a grain shape and soft grains of (110) and (112) are positioned between the strong grains of the existing crystal orientation 10 of (111), such that the mechanical deformation occurring during the process may be accepted well.

Further, since the crystal orientations 20 of (110) and (112) have the twin structure, the grain boundaries are not in disorder and are arranged having a constant rule. Therefore, the grain having the crystal orientations 20 of (110) and (112) may minimize the hindrance of the flow of electrons.

According to the printed circuit board according to the preferred embodiments of the present invention, it is possible to minimize the factors of hindering electrical characteristics, such as electric conductivity, by using the printed circuit board including the metal layer 200 in which the ratio of the area occupied by the crystal orientations 20 of (110) and (112) is 20 to 80%.

Further, according to the printed circuit board according to the preferred embodiments of the present invention, it is possible to provide the printed circuit board including the metal layer 200 having different crystal orientations to improve the isotropy of the mechanical physical property.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims

What is claimed is:

1. A printed circuit board, comprising:
an insulating layer; and
a metal layer formed on the insulating layer,
wherein in the metal layer, a ratio occupied by crystal orientations of (110) and (112) is 20 to 80%.

2. The printed circuit board as set forth in claim 1, wherein the crystal orientations of (110) and (112) are formed in an island type.

3. The printed circuit board as set forth in claim 1, wherein the crystal orientations of (110) and (112) have a twin structure.

4. The printed circuit board as set forth in claim 1, wherein a material of the metal layer includes copper (Cu).

5. A method of manufacturing a printed circuit board, comprising:
preparing an insulating layer;
forming a metal layer on the insulating layer; and
etching the metal layer by dry etching,
wherein in the metal layer, a ratio occupied by crystal orientations of (110) and (112) is 20 to 80%.

6. The method as set forth in claim 5, wherein the forming of the metal layer is performed by a deposition method.

7. The method as set forth in claim 6, wherein the deposition method is sputtering.

8. The method as set forth in claim 5, wherein the etching of the metal layer by dry etching is performed by ion beam etching.

9. The method as set forth in claim 8, wherein an ion source of the ion beam etching is gallium (Ga).

10. The method as set forth in claim 5, wherein the crystal orientations of (110) and (112) are formed in an island type.

11. The method as set forth in claim 5, wherein the crystal orientations of (110) and (112) have a twin structure.

12. The method as set forth in claim 5, wherein a material of the metal layer includes copper (Cu).

* * * * *